(12) United States Patent
Wentzel et al.

(10) Patent No.: US 10,761,117 B2
(45) Date of Patent: Sep. 1, 2020

(54) VOLTAGE SENSOR

(71) Applicant: 3M INNOVATIVE PROPERTIES COMPANY, St. Paul, MN (US)

(72) Inventors: Carl J. Wentzel, Austin, TX (US); Christopher D. Sebesta, Brooklyn, NY (US)

(73) Assignee: 3M Innovative Properties Company, St. Paul, MN (US)

( * ) Notice: Subject to any disclaimer, the term of this patent is extended or adjusted under 35 U.S.C. 154(b) by 116 days.

(21) Appl. No.: 15/573,889

(22) PCT Filed: May 16, 2016

(86) PCT No.: PCT/US2016/032630
§ 371 (c)(1),
(2) Date: Nov. 14, 2017

(87) PCT Pub. No.: WO2016/187090
PCT Pub. Date: Nov. 24, 2016

(65) Prior Publication Data
US 2018/0292435 A1    Oct. 11, 2018

Related U.S. Application Data

(60) Provisional application No. 62/162,910, filed on May 18, 2015.

(51) Int. Cl.
*G01R 19/00* (2006.01)
*G01R 15/16* (2006.01)

(52) U.S. Cl.
CPC ......... *G01R 19/0084* (2013.01); *G01R 15/16* (2013.01)

(58) Field of Classification Search
CPC ................................ G01R 19/84; G01R 15/16
See application file for complete search history.

(56) References Cited

U.S. PATENT DOCUMENTS 4,052,668 A    10/1977    Schmitt
4,963,819 A *  10/1990    Clarke .................. G01R 15/16
                                                      174/73.1

(Continued)

FOREIGN PATENT DOCUMENTS

DE    2460717      6/1976
DE    10056988     5/2002

(Continued)

OTHER PUBLICATIONS

EPRI Smart Grid Demonstration Update, EPRI Smart Grid Demonstration Newsletter, Apr. 2012, pp. 1-10.

(Continued)

*Primary Examiner* — Dominic E Hawkins
(74) *Attorney, Agent, or Firm* — Gregg H. Rosenblatt

(57) ABSTRACT

A voltage sensor comprises a conductor (102) having a first end (101) and a second end (103), the first end including a first connection interface (150) and the second end having no connection, and a sensor section (125) including at least one sensor disposed over the conductor, the sensor sensing the sensor sensing at least a voltage or a sample of the voltage of the conductor. The voltage sensor is coupleable to a power line or cable, such as an overhead power line or cable, or a cable accessory, and can also be used in underground applications.

20 Claims, 3 Drawing Sheets

(56) References Cited

U.S. PATENT DOCUMENTS

| | | |
|---|---|---|
| 6,538,422 B2 | 3/2003 | Potter et al. |
| 2005/0218905 A1 | 10/2005 | Prunk |
| 2011/0204879 A1* | 8/2011 | Peretto ............... G01R 15/14 324/127 |
| 2011/0279108 A1* | 11/2011 | Barnett ............... G01R 15/16 324/76.11 |
| 2012/0139576 A1* | 6/2012 | Dreyer ............... G01R 31/343 324/764.01 |
| 2013/0193991 A1* | 8/2013 | Handshoe ............ G01R 15/16 324/686 |
| 2014/0021965 A1 | 1/2014 | De Rybel |
| 2014/0049249 A1* | 2/2014 | Jespersen ............ G01R 15/247 324/97 |
| 2014/0176164 A1* | 6/2014 | Davis ................. A46B 9/028 324/709 |
| 2014/0253102 A1* | 9/2014 | Wood .................. G01R 1/203 324/140 R |
| 2016/0041203 A1* | 2/2016 | Rostron ............... G01R 15/16 324/658 |

FOREIGN PATENT DOCUMENTS

| | | |
|---|---|---|
| EP | 0071560 | 2/1983 |
| EP | 2608338 | 6/2013 |
| JP | S51-089124 A | 12/1975 |
| JP | S58-026271 A | 7/1982 |
| WO | WO 2013-096354 | 6/2013 |
| WO | WO 2015-179285 | 11/2015 |

OTHER PUBLICATIONS

Tollgrade, "Tollgrade LightHouse® Medium Voltage (MV) Sensors", [retrieved from the internet on Jan. 14, 2018], URL <http://www.tollgrade.com/smartgrid/smart-grid-products/smart-grid-mv-sensor/>, 2 pages.

International Search Report for PCT International Application No. PCT/US2016/032630, dated Sep. 28, 2016, 7 pages.

\* cited by examiner

VOLTAGE SENSOR

TECHNICAL FIELD

The invention relates to a voltage sensor for powerline and/or cable accessories applications.

BACKGROUND

As electrical power distribution becomes more complex through the advent of renewable energy, distributed generation and the adoption of electric vehicles, intelligent electrical distribution and associated electrical sensing is becoming more useful and even necessary. Useful sensing may include, for example, voltage, current, and the time relationship between voltage and current at various locations within a power distribution network.

SUMMARY

In general, this disclosure is directed to a voltage sensor that can be connected to a power line, cable, or cable accessories. In particular, a voltage sensor, comprises a conductor having a first end and a second end, the first end including a first connection interface and the second end having no connection, and a sensor section including at least one sensor disposed over the conductor between the first and second ends, the sensor sensing at least a voltage or a sample of the voltage of the conductor.

In one aspect, the second end has reduced electric field stress concentration. In a further aspect, the second end of the conductor has a rounded surface, such as a fully rounded (or semi-hemispherical) surface. In a further aspect, the second end includes a bulbous rounded surface.

In one aspect, the sensor section includes a voltage sensor. A first electrode of the voltage sensor can comprise the conductor. Alternatively, the first electrode of the voltage sensor comprises an inner shield layer in contact with the conductor. The voltage sensor further includes an insulation layer disposed over the isolated inner shield layer, and an electrically isolated outer shield layer disposed over the insulation layer.

The above summary of the present invention is not intended to describe each illustrated embodiment or every implementation of the present invention. The details of one or more examples of this disclosure are set forth in the accompanying drawings and the description below. Other features, objects, and advantages of the disclosed techniques will be apparent from the description and drawings, and from the claims.

DETAILED DESCRIPTION

In the following Detailed Description, reference is made to the accompanying drawings, to which form a part hereof, and in which is shown by way of illustration specific embodiments in which the invention may be practiced. In this regard, directional terminology, such as "top," "bottom," "front," "back," "leading," "forward," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present disclosure describes a voltage sensor that can be used, for example, to measure the voltage of a power line, such as an overhead power line, at a particular location, such as a capacitor bank, switch or protective device, such as an overhead switch (manual or actuated by a motor, solenoid, etc.), a sectionalizer or recloser, or a voltage regulation transformer, etc. In one aspect, the voltage sensor utilizes an integrated, high accuracy capacitive voltage sensor. The voltage sensor can have a compact design and can be coupled to an existing power line (conductor or cable) in a straightforward manner. The voltage sensor described herein can provide a compact mechanism for providing real time, high accuracy voltage characteristics of a power cable or location in an electrical grid. The output of the voltage sensor can be a waveform that is directly proportional to the voltage of the power line. The division ratio of the actual line voltage to the output voltage can be tailored to any desired voltage. In some embodiments, the division ratio can be between 1:1 and 1,000,000:1; in other preferred embodiments, the division ratio can be approximately 10,000:1, where for example an actual line voltage of approximately 10,000 Volts would result in an output voltage of approximately 1 Volt. The voltage sensor supplies a voltage level that can in some embodiments be easily converted to a digital value for interaction with computational devices, microcontrollers, communication devices, etc. The voltage sensor can thus provide a utility, solar farm, wind farm, ship, industrial plant, or any individual or company that uses medium or high voltage equipment with an easy access to obtain a real time voltage reading of a live power line, as well as the ability to create a smart node at many different grid locations.

Figure 1:
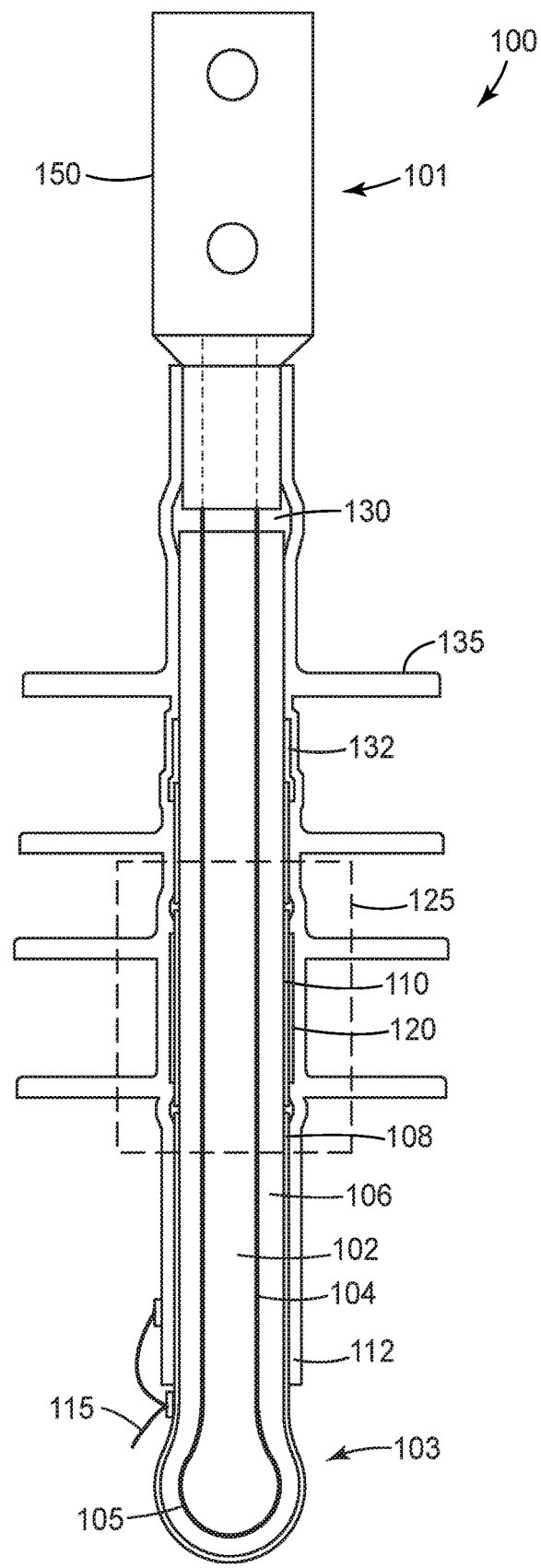
FIG. 1 is a cut away view of a voltage sensor according to an aspect of the present invention.

FIG. 1 shows a first aspect of the invention, voltage sensor 100.

Voltage sensor 100 includes a conductor (also referred to as an inner conductor) 102, which may be a solid or stranded metal axial conductor such as an aluminum or copper alloy conductor. Inner conductor 102 includes a first end 101, which can include a first connection interface 150 and a second end 103. The second end 103 has no connection. In one aspect, the second end is shaped to allow for optimal stress control in a minimal space with ease, to substantially reduce the probability of partial discharge or electrical failure. In one aspect, second end 103 includes a rounded surface 105, such as a fully rounded surface (i.e., having no or almost no sharp edges). This rounded surface shape reduces electric field stress concentration. In one example configuration, such as shown in FIG. 1, the rounded surface 105 has a bulbous shape. Alternatively, depending on the size of conductor 102, if conductor 102 is of large enough diameter, a bulbous end can be omitted. Instead, in some embodiments, a full radius (semi-hemisphere) can be formed from the end 103 of the conductor. This semi-hemispherical shape would also remove any sharp edges that can lead to electric stress concentrations. In a further alternative aspect, the second end 103 of the voltage sensor 100 can be covered with a molded semiconducting rubber or semiconducting plastic material. In this alternative aspect, the semiconducting molding can be used to cover a rounded surface or a sharp surface.

The first connection interface 150 can include a lug, which is shown in FIG. 1. Alternatively, the connection interface can comprise a separable connector, a splice, a modular connector, or other connection interfaces.

The connection interface can have a circular cross section configured to mate to a male end of conductor 102. In alternative aspects, the first end of the conductor 102 can be formed as a male or hybrid type connector.

As shown in FIG. 1, connection interface 150 comprises a lug. The structure of FIG. 1 allows for straightforward mechanical fastening and electrical conduction (or path) from an overhead power cable or line. For example, one method of attaching the voltage sensor 100 to an overhead line is to use a conventional overhead primary tap (such as a BHF/AHF two hole hot line pad connector available from Hubbell Power Systems, USA) and bolt that connector to connection interface/lug 150. Alternatively, a conventional stem connector can be used. As such, voltage sensor 100 can be installed at any point along a power cable, line or in a cable accessory.

Moreover, voltage sensor 100 is configured to control the electrical field created by medium or high voltage within a power line or cable, such as an overhead power line or cable, wherein the power line or cable operates at voltages in excess of 1,000 Volts. As shown in FIG. 1, a high K layer 132 can be employed to control the electric field. Alternatively, voltage sensor 100 can include geometric stress control (not shown).

Optionally, in some aspects, inner conductor 102 may be radially surrounded by conductor shield layer 104. Conductor shield layer 104 comprises a conductive or semi-conductive material that is configured to smooth out any conductor surface inconsistencies that could create high electric field stress concentrations, especially when sensing the voltage of a medium or high voltage line or cable, which could cause a reduction in accuracy or possible sensor failure. In one aspect, the outer surface of the conductor shield layer 104 is smooth. As will be described in further detail below, the inner conductor 102 and optional inner shield layer 104 provide one electrode of a capacitor for the sensor section. The other electrode of the capacitor is formed by the isolated section 110 of insulation shield layer 108, and insulation layer(s) 106 serves as the dielectric of the capacitor.

Voltage sensor 100 further includes insulation layer 106, which concentrically surrounds conductor shield layer 104. The insulation layer 106 can be formed from a conventional dielectric material, such as elastomeric silicone, ethylene propylene diene monomer rubber (EPDM), hybrids or combinations thereof. Alternatively, insulation layer 106 can comprise more than 1 layer of insulation material, such as first and second insulation layers (not shown), with each layer being formed from a different or same insulation material. The optional semi-conductive or conductive shield layer 104 functions to eliminate or reduce the potential for voids between conductor 102 and insulation layer(s) 106 that might allow leakage leading to degradation of insulation layer(s) 106. Shield layer 104 may also relieve electrical stresses caused by any roughness on the surface of the inner conductor 102 due to, for example, manufacturing processes such as casting.

In an alternative aspect, conductive layer 102 can have a highly smooth outer surface. As such, an adhesive or other bonding material can be interposed between the conductive layer 102 and the insulation layer 106, with the shield layer 104 being omitted. The adhesive or other bonding material can be applied to the outer surface of conductor 102 and can bond the insulation layer 106 to the conductive layer 102.

In addition, an insulation shield layer 108 is provided and concentrically surrounds insulation layer 106. The insulation shield layer 108 comprises a conductive or semiconductive material formed as a layer adjacent to and concentrically surrounding insulation layer 106. As described below, for purposes of the sensing section 125, this insulation layer 106 also forms the insulation layer of a capacitor, which also comprises the inner conductor 102 and/or conductor shield layer 104 and isolated section 110 of insulation shield layer 108. Isolated section of insulation shield layer 110 is isolated from the ground potential of the remainder of insulation shield layer 108.

In the embodiment of FIG. 1, voltage sensor 100 further comprises a tubular sleeve 112 that extends over at least a portion of the conductor/inner shield/insulation/shield structure and the sensor section 125. In one aspect, tubular sleeve 112 comprises a suitable cold-shrinkable material, such as a highly elastic rubber material that has a low permanent set, such as EPDM, elastomeric silicone, electrical grade resin, or a hybrid thereof. Insulation layer 106 and tubular sleeve can be made of the same or different types of materials. The semi-conductive and insulating materials may have differing degrees of conductivity and insulation based on the inherent properties of the materials used or based on additives added to the materials. Tubular sleeve 112 may also be made from a suitable heat-shrinkable material. Alternatively, the tubular sleeve 112 may be an overmolded or push-on layer. A ground reference wire 115 can also be provided. Optionally, in the illustrated embodiment, tubular sleeve 112 includes skirts 135 which serve to reduce leakage current and which is particularly useful for outdoor applications. In some embodiments, tubular sleeve 112 can also cover rounded end 103.

In addition, a sealing compound 130 can be provided to create an environmental seal and prevent moisture from migrating into the area between the insulation layer 106 and the connection interface/lug 150.

Figure 2:
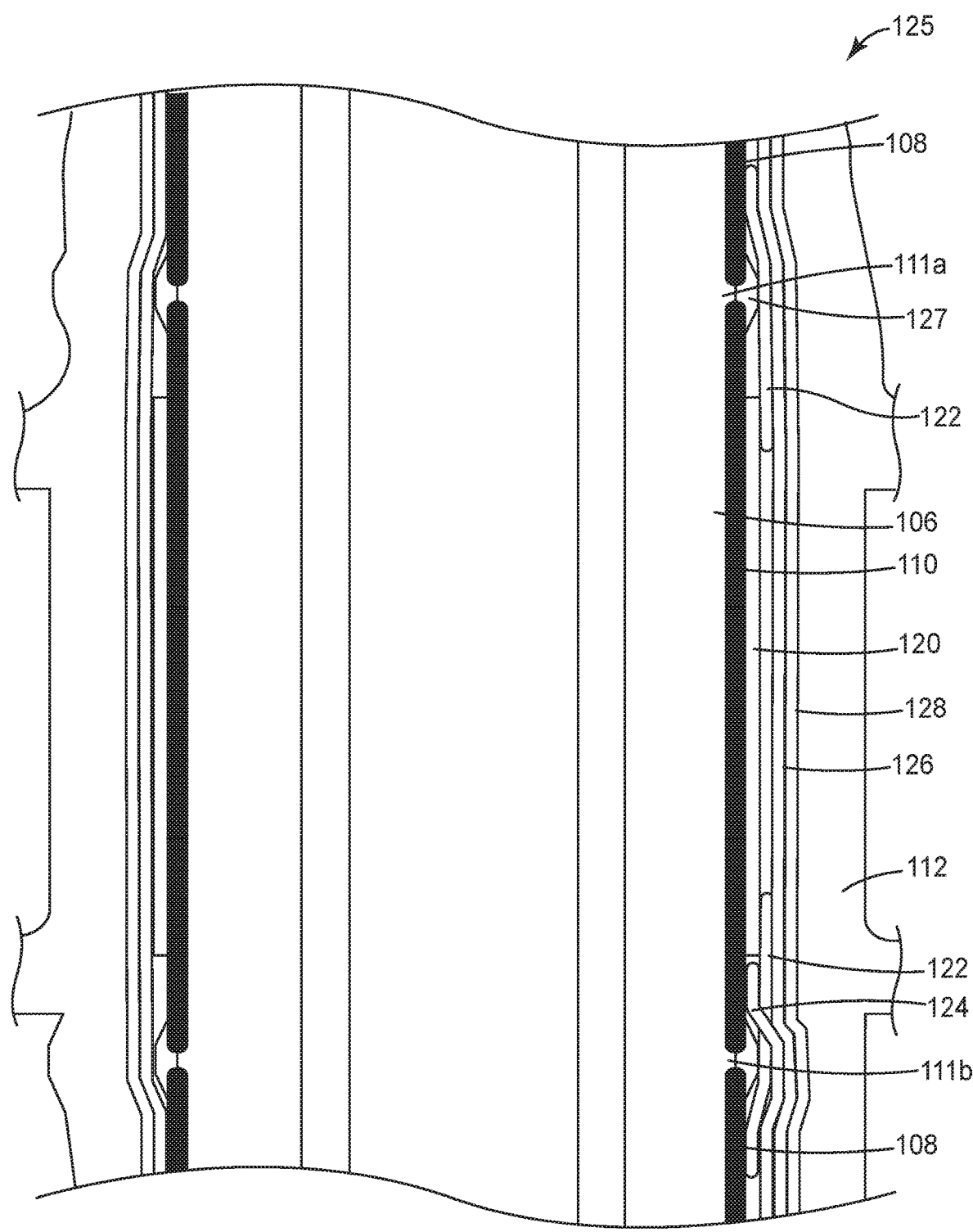
FIG. 2 is a close-up section view of the sensing section of the voltage sensor according to another aspect of the present invention.

As shown in FIG. 1, and in greater detail in FIG. 2, voltage sensor 100 includes a sensor section 125 disposed between the first and second ends of conductor 102. In one aspect, the sensing section includes a voltage sensor, such as an impedance voltage divider that utilizes complex impedance based voltage division, or a capacitive voltage sensing device, having an electrically isolated capacitive voltage sensor. More generally, in at least one aspect, where the sensing section includes an impedance voltage divider, a first impedance and a second impedance are connected in series. The input voltage is applied across the series impedances and the output voltage is the voltage across the second impedance. The first and second impedances may be composed of any combination of elements such as resistors, inductors and capacitors. In at least one aspect, the sensing section includes a multi-component AC circuit, wherein the response can be complex and can have imaginary components. In another aspect, the sensor section includes at least one temperature compensation component, such as, e.g., a thermistor. The temperature sensor (e.g., thermistor) can be located within (or outside of) the sensing section 125. While one specific embodiment is described below, the sensing section can also be configured in a manner similar to the voltage sensors described in International Publ. Nos. WO 2015/179285 and WO 2013/096354, each incorporated by reference herein in their entirety. Moreover, in a further alternative aspect, the voltage sensor 100 can further include one or more additional sensors.

As shown in FIG. 2, the sensing section 125 includes an electrically isolated section 110 of conductive or semiconductive material (insulation shield) layer 108 in contact with an outer surface of insulation layer 106. The electrically isolated section 110 of conductive or semiconductive material (insulation shield) layer 108 forms an electrode of a sensing capacitor of a capacitive voltage divider or sensor. The electrically isolated section thus can be capacitively coupled to the conductor 102 and electrically isolated from ground potential. In addition, insulation layer 106 is operable to form a dielectric of the sensing capacitor of the capacitive voltage divider or sensor.

In some examples, the electrically isolated section 110 may be in an annular ring configuration and be electrically isolated from conductive or semiconductive shielding layer 108 by non-conductive axial sections 111a and 111b. Non-conductive axial sections 111a, 111b may comprise non-conductive material or a void.

In such examples, conductive or semiconductive shielding layer 108 may be discontinuous at two longitudinal positions to form electrically isolated section 110 in the annular ring configuration. In such examples, electrically isolated section 110 may be formed out of a common material and manufacturing process, such that electrically isolated section 110 and shield layer 108 have a common thickness.

In other examples, electrically isolated section 110 may be formed from a different material than shield layer 108 and/or have a different configuration such as a rectangular or round shape formed by a flexible material affixed to insulation layer 106. Electrically isolated section 110 may, for example, comprise an electrically conductive metal or an electrically conductive polymer. As one example, electrically isolated section 110 may comprise a layer of copper. In some examples, voltage sensor 100 may include an adhesive that affixes electrically isolated section 110 to insulation layer 106. In some examples, electrically isolated section 110 may further include a conforming rubber insulation or high dielectric constant tape or a self-fusing insulation or high K material 127, such as a rubber mastic material, to prevent moisture from migrating into the sensor section 125. In some aspects, strips of insulating or high dielectric constant material cover gaps 111a, 111b to separate isolated section 110 from any other conductive or semiconductive material or elements, except from the PCB 120, and to prevent the presence of air in gaps 111a, 111b, which air could cause a partial electrical discharge and a failure of the voltage sensor. The insulating or high dielectric constant material may be any suitable material such as a combination of mastic, which will more easily fill gaps 111a, 111b, and PVC tape placed over the mastic. In some examples, the electrically isolated section 110 may include a heat shrinkable or cold shrinkable material.

In some aspects, inner and outer conductive or semiconductive shield layers 104, 108 and insulating layer 106 of voltage sensor 100 may be made from any materials suitable for shrinkable sleeve applications. Most suitable are materials such as a highly elastic rubber material that has a low permanent set, such as ethylene propylene diene monomer (EPDM), elastomeric silicone, or a hybrid thereof, that may include conventional additives to make the layers appropriately conductive, semiconductive or insulating, as needed.

The conductive or semiconductive shield layers and the insulation layer may be made of the same or different types of materials, depending on the types of additives which may be incorporated in the individual layers. The inner and outer conductive or semiconductive shield layers and the insulation layer may have differing degrees of conductivity and insulation based on the inherent properties of the materials used or based on additives added to the materials.

As mentioned above, in some aspects, the sensor section 125 is configured as a capacitive voltage sensor, which is operable to sense a voltage on inner conductor 102, which is also representative of the voltage on the power line (not shown) by way of the connection with the connection interface 150. Electrically isolated section 110 is operable to form an electrode of the sensing capacitor of the capacitive voltage sensor and may, for example, have two opposed major surfaces, e.g. first and second major surfaces. The first major surface may be in mechanical contact with insulation layer 106. The second major surface may be in mechanical contact with a capacitive element, such as a capacitor, circuitry, or a printed circuit board (PCB) 120. In many aspects, the capacitive element, such as PCB 120, has a pre-defined capacitance value.

As mentioned previously, the output of the voltage sensor can be a waveform that is directly proportional to the voltage of the power line. The division ratio of the actual line voltage to the output voltage can be tailored to any desired voltage. In some embodiments, the division ratio can be between 1:1 and 1,000,000:1; in other aspects, the division ratio can be approximately 10,000:1, where for example an actual line voltage of approximately 10,000 Volts would result in an output voltage of approximately 1 Volt. The voltage sensor 100 supplies a voltage level that can in some embodiments be easily converted to a digital value for interaction with computational devices, microcontrollers, communication devices, etc.

The capacitive voltage sensor further includes capacitive element (here PCB 120), which is in electrical contact with electrically isolated section 110. In one aspect, the PCB 120 is located close to or directly over the electrically isolated section 110 to arrange for the electrical contact with the isolated section 110, which in turn is arranged on insulation layer 106. PCB 120 further includes at least one additional capacitor or other capacitive element to form a capacitive voltage divider for determining the voltage of inner conductor 102 by way of the detected voltage of electrically isolated section 110. The capacitor(s) of PCB 120 may be electrically connected to electrically isolated section 110. The capacitive element may be operable as a secondary capacitor in a capacitive voltage divider. The capacitive voltage divider may comprise the sensing capacitor, which includes electrically isolated section 110, and the secondary capacitor.

In some aspects, PCB 120 may be flexible such that PCB 120 may be bent to conform around electrically isolated section 110. PCB 120 may establish electrical contact to electrically isolated section 110 in several locations. This construction avoids the disadvantages of having electrical contact only in one location on electrically isolated section 110, such as, problems resulting from a bad electrical contact in the one location, if that one contact is, e.g., incomplete, corroded, or damaged, which might preclude a voltage reading. In addition providing multiple points of contact may avoids problems arising from the fact that electrons travelling from a rim of electrically isolated section 110 to a single contact location experience the electrical resistance of electrically isolated section 110 over a longer path. This, in turn, may lead to a voltage drop and eventually to a lower, i.e. less accurate, voltage being measured on PCB 120.

In some examples, PCB 120 may be mechanically attached to electrically isolated section 110. In other examples, PCB 120 may alternatively be in a pressure contact with electrically isolated section 110. PCB 120 may comprise a double-sided PCB, i.e. PCB 120 can have opposed first and second major sides. Alternatively the PCB 120 can be located remotely from the isolated section 110, where the PCB 120 can be electrically coupled to the isolated section 110.

Figure 3:
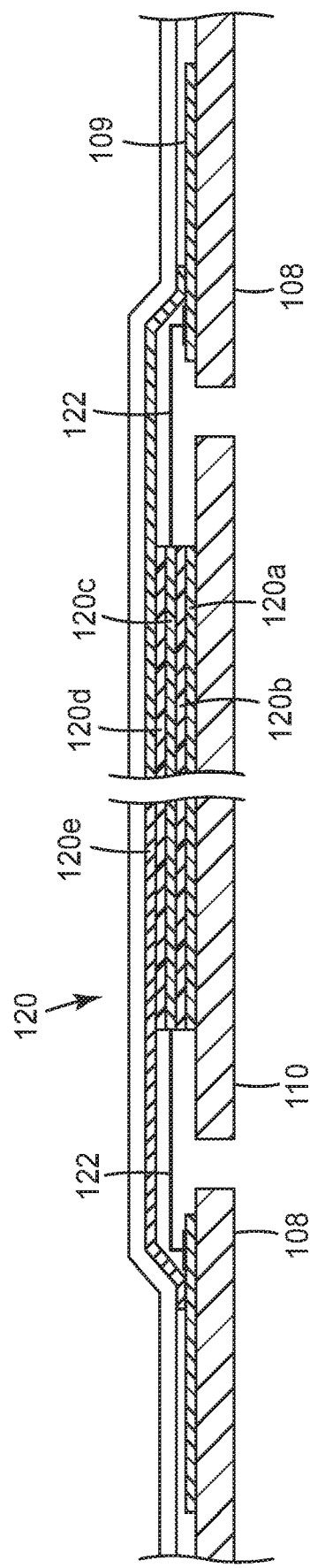
FIG. 3 is a close-up, cross section view of the voltage sensor according to another aspect of the present invention.

For example, as further illustrated in FIG. 3, PCB 120 can comprise a multilayer structure, with a first layer 120*a* comprising a conductive metal, e.g. gold, silver, or copper; a second layer 120*b* comprising a flexible insulation material; a third layer or conductive trace 120*c* to connect to jumper wires 122; a fourth layer 120*d* comprising an outer insulation layer; and an outer conductive shield layer 120*e* comprising a conductive or semiconductive layer which shields PCB 120.

In one example, the first layer 120*a* can comprise a copper layer that may be gold-plated for enhanced electrical contact and/or for protection against environmental influences, e.g. against corrosion. In different examples, first PCB layer 120*a* comprises a conductive region that provides a continuous surface contact area or a patterned, i.e. interrupted, non-continuous, surface contact area for contact with electrically isolated section 110. All parts of the patterned surface contact area may be electrically connected with each other. A patterned surface contact area may require less conductive material for manufacturing it, while having only a negligible influence on reliability of the electrical contact and resistive losses.

PCB 120 may comprise a flexible portion. A patterned surface contact area may also enhance the mechanical flexibility of PCB 120, thus reducing the risk of layer cracking and/or flaking, when PCB 120 is bent. In a specific example, the first PCB layer 120*a* comprises a patterned gold-plated copper layer. A pattern of the surface contact area may, for example, be a grid with a square-shaped or a diamond-shaped pattern.

The PCB 120 may further comprise a second layer 120*b* comprising a flexible insulating material, such as a conventional, flexible insulation material.

A flexible portion of PCB 120 and in particular a flexible PCB may allow PCB 120 to conform better to electrically isolated section 110. This, in turn, enhances the electrical contact between PCB 120 and electrically isolated section 110 and thereby makes the contact more reliable, reduces resistive losses, and facilitates higher accuracy of the voltage sensor.

A conductive trace 120*c* connects with jumper wires 122, which are connected to ground on either side of the isolated section 110 by conductive tape/adhesive 109 disposed on shield layer 108. The conductive tape/adhesive 109 provides adequate surface area. The outer shield layer 120*e* can comprise a conductive or semiconductive material and is grounded to conductive tape/adhesive 109, as shown in FIG. 3.

Although not shown, PCB 120 may further include a plurality of ratio adjustment capacitors.

PCB 120 may generate a signal that is indicative of the voltage of inner conductor 102. Sensor signal wire 124 can be connected to PCB 120 for transmitting the sensor voltage signal from PCB 120. In some examples, electrical measurement circuitry may be incorporated into the PCB 120; in other examples, PCB 120 may include electrical measurement circuitry. Sensor signal wire 124 they may be connected to, for example, a remote terminal unit that processes voltage data from the sensor section 125, or an integrator, a measuring device, a control device, or other suitable types of devices.

A ground reference wire 122 may be used to bring ground onto PCB 120 for connecting electrical ground to the electrical measurement circuitry. In one aspect, ground reference wire 122 is connected to a conductive trace of PCB 120, such as conductive trace 120*c* shown in FIG. 3. This configuration brings a bridging connection between the insulation shield layers on either side of isolated section 110. The electric measurement circuitry may be operational to determine the voltage of inner conductor 102 versus ground.

In some examples, PCB 120 may be adapted to support additional sensing such as temperature, humidity, magnetic field, etc.

In an alternative aspect, PCB 120 can be directly disposed on insulation layer 106, such that the isolated section 110 of the shielding layer 108 can be eliminated. In a further alternative aspect, PCB 120 can be disposed directly on insulation layer 106 at a position beyond an end of the shielding layer 108.

In one aspect, the sensor section 125 further includes a sensor insulation layer 126 that is disposed adjacent to the isolated section 110. In another aspect, the sensor insulation layer 126 can be adjacent to the PCB 120 and on the opposing side of PCB 120 relative to electrically isolated section 110. The sensor insulation layer 126 helps to prevent the PCB 120 from shorting out.

In a further aspect, the sensor section 125 further includes a sensor (outer) shielding layer 128 that is disposed adjacent to sensor insulation layer 126 on the opposing side of sensor insulation layer 126 relative to PCB 120. Outer sensor shield layer 128 may be formed from a conductive or semiconductive material and may be electrically connected to shield layer 108, e.g., at ground potential. Outer sensor shield layer 128 provides electric field shielding to contain the electric field from the isolated section 110/outer electrode and from external electric fields. Outer sensor shield layer 128 and insulation shield layer 108 may function to substantially encapsulate the capacitive voltage sensor, including the electrically isolated section 110, PCB 120 and sensor insulation layer 126. In some examples, outer sensor shield layer 128 and insulation shield layer 108 may be formed as a unitary feature. In addition, as shown in FIG. 2, tubular sleeve 112 extends over at least a portion of the sensor section 125.

The precise dimensional control facilitated by the design and configuration of voltage sensor 100 allows for precise voltage measurements by the capacitive voltage sensor of the sensor section 125. For example, capacitance is directly related to the geometry of two conductive electrodes and the insulation forming the capacitor. With respect to the capacitive voltage sensor, the sensing capacitor is formed from inner conductor 102/inner shield layer 104, insulation layer 106 and electrically isolated section 110.

In some examples, voltage sensor 100 may be formed using overmolded construction. For example inner shield layer 104 may be overmolded on inner conductor 102. Similarly, insulation layer 106 may be an overmolded insulation layer overmolded on inner shield layer 104 or overmolded directly on inner conductor 102 if inner shield layer 104 is not included in the voltage sensor device 100. Likewise, shield layer 108 may be an overmolded outer conductive or semiconductive layer overmolded on insulation layer 106. As such, in some aspects, the construction can comprise a multilayer body that can be formed as a contiguous overmolded body that comprises the insulation layer 106, shield layer 108, the isolated section 110, and optionally the inner shield layer 104.

In another aspect, the voltage ratio of the sensing section 125 can be adjusted by varying the length of the isolated section 110 or, in an alternative aspect, by varying the length of the PCB 120 that replaces isolated section 110. RTV, grease, mastic, or other insulating or high dielectric constant materials can be applied to eliminate air gaps/voids between the PCB 120 and the cable insulation 106 and/or to eliminate corona discharges.

The voltage sensor described herein can be utilized in a variety of applications. For overhead applications, the voltage sensor can be deployed on any section of the power grid having a voltage, such as with standard medium or high voltage cable, bus bars, capacitor banks, connectors, lugs, jumpers, any component used in a power grid, switches, and switch gear. In other applications, the voltage sensor can be used in underground equipment applications such as pad mounted transclosures, pad mounted primary metering cabinets, and many live front pad mounted or vault-type live front applications. The voltage sensor can also be used in switch gear applications, where the gear is considered dead-front underground equipment.

Although specific embodiments have been illustrated and described herein for purposes of description of the preferred embodiment, it will be appreciated by those of ordinary skill in the art that a wide variety of alternate or equivalent implementations may be substituted for the specific embodiments shown and described without departing from the scope of the present invention. Those with skill in the art will readily appreciate that the present invention may be implemented in a very wide variety of embodiments. This application is intended to cover any adaptations or variations of the embodiments discussed herein.

What is claimed is:

1. A voltage sensor, comprising:
   a conductor having a first end and a second end, the first end including a first connection interface configured to be coupled to a power grid device, power line or component having a voltage and the second end having no connection to a power grid device, power line, or component having a voltage, and
   a sensor section including at least one sensor disposed over the conductor between the first end and the second end, the sensor sensing at least a voltage or a sample of the voltage of the conductor.

2. The voltage sensor of claim 1, wherein the second end comprises a fully rounded, semi-hemispherical surface.

3. The voltage sensor of claim 1, wherein the sensor section includes a capacitive voltage sensor having an inner shield layer in contact with the conductor, an insulation layer disposed over the inner shield layer, and an electrically isolated outer shield layer disposed over the insulation layer.

4. The voltage sensor of claim 3, wherein the outer shield layer comprises an electrically isolated section of conductive or semiconductive material, wherein the electrically isolated section of conductive or semiconductive material forms an electrode of a capacitive voltage sensor.

5. The voltage sensor of claim 1, wherein the connection interface comprises one of a lug, a stem connector, a separable connector, a splice, and a modular connector.

6. The voltage sensor of claim 5, wherein the connection interface is coupleable to an overhead power line or cable.

7. The voltage sensor of claim 1, further including an outer sleeve comprising a tubular body formed from an anti-tracking insulation material.

8. The voltage sensor of claim 7, wherein the outer sleeve further includes a plurality of skirts.

9. The voltage sensor of claim 1, wherein the sensor section includes a capacitive element.

10. The voltage sensor of claim 9, wherein the capacitive element comprises a printed circuit board having at least one of a predefined capacitance, impedance and resistance.

11. The voltage sensor of claim 1, wherein the sensing section includes an impedance voltage divider, wherein a first impedance and a second impedance are connected in series.

12. The voltage sensor of claim 11, wherein the first and second impedances include any combination of elements including resistors, inductor and capacitors.

13. The voltage sensor of claim 1, wherein the sensing section includes a multi-component AC circuit, wherein the response is complex and has imaginary components.

14. The voltage sensor of claim 4, wherein the sensor section includes a capacitive element in electrical contact with the electrically isolated section of the conductive or semiconductive material.

15. The voltage sensor of claim 10, further including a ground reference wire coupled to the printed circuit board.

16. The voltage sensor of claim 2, wherein the fully rounded surface comprises a bulbous surface.

17. The voltage sensor of claim 1, further comprising a conductor shield layer covering at least the second end of the conductor, wherein the conductor shield layer is configured to smooth out any conductor surface inconsistencies that could create high electric field stress concentrations.

18. The voltage sensor of claim 1, further comprising at least one sensor output wire.

19. The voltage sensor of claim 1, wherein the sensor section further comprises at least one temperature compensation component.

20. The voltage sensor of claim 1, wherein the sensor section includes a voltage sensor having an insulation layer disposed over the conductor, and an electrically isolated outer shield layer disposed over the insulation layer, wherein the conductor forms a first electrode of a capacitor and the electrically isolated outer shield layer comprises a second electrode of the capacitor.

* * * * *